US012733309B2

(12) United States Patent
Zhang et al.

(10) Patent No.: US 12,733,309 B2
(45) Date of Patent: Sep. 8, 2026

(54) LIGHT EMITTING DEVICE WITH COLOR ADJUSTMENT AND COLOR TEMPERATURE ADJUSTMENT FUNCTIONS

(71) Applicant: KAISTAR Lighting (Xiamen) Co., Ltd., Xiamen (CN)

(72) Inventors: Jingqiong Zhang, Xiamen (CN); Yehyin Chou, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 568 days.

(21) Appl. No.: 18/299,848

(22) Filed: Apr. 13, 2023

(65) Prior Publication Data

US 2023/0411566 A1 Dec. 21, 2023

(30) Foreign Application Priority Data

Jun. 15, 2022 (CN) ......................... 202210676253.5

(51) Int. Cl.
*H10H 20/851* (2025.01)
*H10W 90/00* (2026.01)

(52) U.S. Cl.
CPC ........ *H10H 20/8513* (2025.01); *H10W 90/00* (2026.01)

(58) Field of Classification Search
CPC ............ H10H 20/8513; H01L 25/0753; F21Y 2113/13; F21Y 2113/17
See application file for complete search history.

(56) References Cited

U.S. PATENT DOCUMENTS 11,817,531 B1 * 11/2023 Li .......................... C09K 11/02
2010/0237766 A1 * 9/2010 Baumgartner .......... F21K 9/232 445/3
2012/0223657 A1 * 9/2012 Van de Ven ........... H05B 45/46 315/297
2012/0274240 A1 * 11/2012 Lee .................... H10H 20/8513 252/301.4 R
2013/0056765 A1 * 3/2013 Thompson ........... H10H 20/851 257/E33.061
2018/0103513 A1 * 4/2018 Tseng ..................... H05B 45/00
2018/0108816 A1 * 4/2018 Todorov ............. H10H 20/8513
2021/0181405 A1 * 6/2021 Nichol ................ G02B 6/0085

* cited by examiner

*Primary Examiner* — James R Greece
*Assistant Examiner* — Michael Chiang
(74) *Attorney, Agent, or Firm* — Hemisphere Law, PLLC

(57) ABSTRACT

A light emitting device is provided. The device includes a red light emitting unit, a blue light emitting unit, a green light emitting unit, and a white light emitting unit. The red light emitting unit includes a first blue light emitting chip and a red fluorescent material, and a dominant wavelength of a light emitted by the red light emitting unit is in a range of 615 nanometers (nm) to 635 nm. By designing the light emitting device into a structure including the red light emitting unit, the blue light emitting unit, the green light emitting unit and the white light emitting unit, and designing the structure of the red light emitting unit, the light emitting device can realize the adjustment of ambient light and color temperature by the four light emitting units, thereby reducing cost.

19 Claims, 3 Drawing Sheets

10

11 12 13 14

10

LIGHT EMITTING DEVICE WITH COLOR ADJUSTMENT AND COLOR TEMPERATURE ADJUSTMENT FUNCTIONS

TECHNICAL FIELD

The disclosure relates to a lighting technical field, in particular to a light emitting device.

BACKGROUND

With applications of intelligent lamps to home lighting. People not only require dimming the luminance, but also pursue dimming the color temperature of the white light and tuning ambient light which is also called tuning the color chromaticity.

Since a good chromaticity tunable function means a wide color gamut which requires the R\G\B light beam participating in the light adjustment has a narrower FWHM (Full Width Half Maximum) and suitable luminance. But for the dimming of the color temperature, it is hoped that at least two white lights with different color temperatures participating in color temperature dimming will have a better continuous spectrum which required that the FWHM of each light beam mixed into the white light should not be too narrow. Therefore, in order to realize the above tuning and dimming function, the existing lamps usually use at least five different components to independently complete the color tuning and dimming.

SUMMARY

This disclosure provides a different solution, it provides a light emitting device, which can dim the color temperature and tune ambient light only by four different light emitting units.

The disclosure provides a light emitting device which includes a red light emitting unit, a green light emitting unit, a blue light emitting unit, and a white light emitting unit. The red light emitting unit includes a first blue light emitting chip and a red fluorescent material, and a dominant wavelength of a light emitted by the red light emitting unit is in a range of 615 nanometers (nm) to 635 nm.

The above technical solution can have one or more of the following advantages or beneficial effects: the light emitting device is designed with a structure including a red light emitting unit, a blue light emitting unit, a green light emitting unit and a white light emitting unit; by designing the structure of the red light emitting unit, the light emitting device can tune ambient light and dim color temperature by the four light emitting units to reduce cost.

BRIEF DESCRIPTION OF DRAWINGS

In order to more clearly explain the technical solution of the disclosure, the following will briefly describe attached drawings needed in the description of the embodiments. Apparently, the attached drawings in the following description are only some of the embodiments of the disclosure. For those skilled in the art, other drawings can be obtained from these attached drawings without paying creative works.

DETAILED DESCRIPTION OF EMBODIMENTS

The following will clearly and completely describe technical solutions in the embodiments of the disclosure with reference to the attached drawings in the embodiments of the disclosure. Apparently, the described embodiments are only some of the embodiments of the disclosure, not all of them. Based on the embodiments of the disclosure, all other embodiments obtained by those skilled in the art without creative works should belong to the scope of protection of the disclosure.

Figure 1:
FIG. 1 is a schematic structural diagram of a light emitting device provided by an embodiment of the disclosure.
Figure 1:
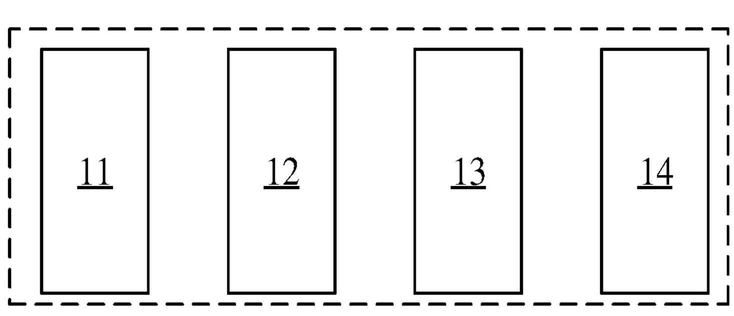

As shown in FIG. 1, the disclosure provides a light emitting device 10. The light emitting device 10 is one selected from a group consisting of an RGBW lamp, a chip on board (COB) light source or Surface Mounted Devices (SMD), and the light emitting device 10 has tuning and dimming functions such as tuning ambient light and diming color temperature. Specifically, the light emitting device 10 includes a red light emitting unit 11 (R), a blue light emitting unit 12 (B), a green light emitting unit 13 (G), and a white light emitting unit 14 (W). It can be understood that the four light emitting units mentioned above are controlled by independent circuits, that is, the four light emitting units are lit by different control circuits.

Specifically, the green light emitting unit 13 emits a green light. Furthermore, the green light emitting unit 13 includes at least one green chip (not shown in attached drawings), and a dominant wavelength of the green chip is in a range of 515 nm to 535 nm.

The blue light emitting unit 12 emits a blue light. Specifically, the blue light emitting unit 12 includes at least one blue chip (not shown in attached drawings), and a dominant wavelength of the blue chip is in a range of 460 nm to 475 nm.

The red light emitting unit 11 includes a first blue light emitting chip and a red fluorescent material. Here, the red fluorescent material is a fluorescent material that emits a red light after being excited. Specifically, a dominant wavelength of the first blue chip is in a range of 445 nm to 460 nm. The red fluorescent material includes a first red phosphor and a second red phosphor. Specifically, the first red phosphor is a KSF (i.e., $K2SiF6:Mn^{4+}$, a tetravalent manganese fluoride) phosphor. It should be noted that the KSF phosphor itself is yellow, but it will emit a red light after being excited by a blue light, so that it is also called red phosphor. The second red phosphor is a long-wavelength nitride red phosphor. In an embodiment, the long-wavelength nitride red phosphor is a nitride red phosphor which has a peak wavelength in a range of 635 nm to 660 nm. The nitride red phosphor is generally called CASN or 1113 phosphor, and a basic composition of the nitride red phosphor is CaAlSiN3:Eu. Specifically, a FWHM of the KSF phosphor is very narrow and less than 30 nm in common, and has a peak. Therefore, the luminance of the KSF phosphor is high, which is conducive to tuning the ambient light. Compared with the KSF phosphor, the second red phosphor has a higher wavelength band and a wider FWHM. When spectral overlap occurs, it can be understood that an overlapped spectrum is more continuous if the FWHW is wider, and thus a light of the overlapped spectrum is closer to a natural light and has a higher color rendering index, which is conducive to dimming the color temperature. Therefore, the light emitting device 10 including the above-mentioned red light emitting unit 11, blue light emitting unit 12, green light emitting unit 13 and white light emitting unit 14 can realize the tuning of ambient light and dimming of the color temperature.

The white light emitting unit 14 includes a second blue light emitting chip with a dominant wavelength being in a range of 445 nm to 460 nm and a multicolor fluorescent material. It can be understood that the multicolor fluorescent material can convert a blue light emitted by the second blue light emitting chip into lights of other colors, and thus the lights of other colors can be mixed with the blue light of the second blue light emitting chip not absorbed by the multicolor fluorescent material to form a white light. Specifically, the multicolor fluorescent material includes a third red phosphor. Specifically, the third red phosphor is a short-wavelength red phosphor (for example, the short-wavelength red phosphor is a short-wavelength red phosphor with a peak wavelength less than 635 nm), and thus a part of the blue light emitted by the second blue light emitting chip passes through the third red phosphor to emit a red light. In addition, the multicolor fluorescent material further includes at least one of a green phosphor and a yellow-green phosphor. For example, the green phosphor such as $Lu_3Al_5O_{12}$:Ce (LuAG) and $Y_3(Ga,Al)_5O_{12}$:Ce (GaYAG); the yellow-green phosphor such as SiAlON:Eu (β-sialon), and the disclosure is not limited to these. In an embodiment, the third red phosphor used in the white light emitting unit 14 of the disclosure is a nitride red phosphor having a peak wavelength of an emission (i.e., a red light emitted by the third red phosphor) in a range of 605 nm~620 nm, the nitride red phosphor is generally called CASN or 1113 phosphor, a basic composition of the nitride red phosphor is CaAlSiN3:Eu. The nitride red phosphor can be added strontium (Sr) element to form (Sr,Ca)AlSiN3:Eu according to a selection of a wavelength, thereby to make the peak wavelength of the nitride red phosphor move to a direction of short waves. The (Sr,Ca)AlSiN3:Eu can also be called CASN or 1113 phosphor for short, and a basic composition of the (Sr,Ca)AlSiN3:Eu is CaAlSiN3:Eu, and different peak wavelengths represents different contents of the strontium element in the (Sr,Ca)AlSiN3:Eu. In an embodiment, a color temperature of the white light emitting unit 14 is in a range of 1800 Kelvin (K) to 3000K, the following embodiments only exemplified at 3000 K, it should be understood that the color temperature of the white light emitting unit 14 can be any other value. The white light emitting unit 14 includes one or more the second blue light emitting chip with a dominant wavelength being in a range of 445 nm to 460 nm.

It can be understood that the structure of the light emitting device 10 shown in FIG. 1 is just a simple illustration of the embodiment of the disclosure, the structure of the light emitting device 10 includes four light emitting units, the four light emitting units include the red light emitting unit 11, the blue light emitting unit 12, the green light emitting unit 13, and the white light emitting unit 14. Each of the four light emitting units includes at least one light emitting chip. In an embodiment of the disclosure, the light emitting device 10 can be a lamp that combines one or more groups of RGBW light emitting components, the RGBW light emitting component such as SMD (also called as emitter); and the light emitting device 10 can also be a chip on board (COB) or a lamp that combines one or more groups of RGBW chip scale packages (CSP). The four light emitting units RCBW are not limited to four independently detachable light emitting components, they can also be different parts that are fixedly combined for use in a single light emitting device, such as a single cup lamp bead or a multi-cup lamp bead. In a word, the red light emitting unit 11, the blue light emitting unit 12, the green light emitting unit 13, and the white light emitting unit 14 can be different light emitting components or different parts of the same light emitting component.

Figure 2:
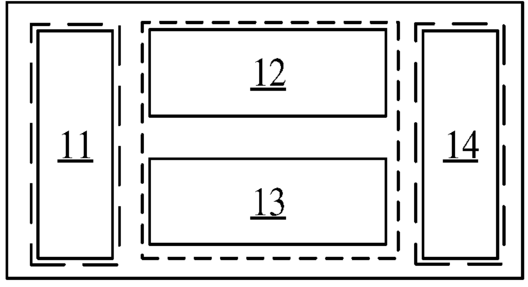
FIG. 2 is a schematic structural diagram of another light emitting device provided by an embodiment of the disclosure.

Specifically, as shown in FIG. 2, in an embodiment of the disclosure, the light emitting device 10 may include a structure consisting of three cups. One of the three cups includes the red light emitting unit 11 which includes the first blue light emitting chip and a package glue added with the long-wavelength nitride red phosphor. Another one of the three cups includes the white light emitting unit 14 which includes the second blue light emitting chip and a package glue added with the multicolor fluorescent material. The remaining one of the three cups includes the blue light emitting unit 12 and the green light emitting unit 13. Specifically, the blue light emitting unit 12 and the green light emitting unit 13 are not added with any phosphor, and thus this cup only needs to be added with a package glue such as a silica gel material to protect the chips. It should be noted that each of the three cups can includes one or more light emitting chips.

Figure 3:
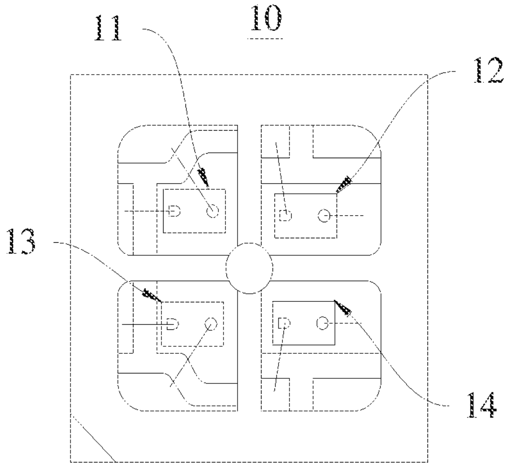
FIG. 3 is a schematic structural diagram of a still another light emitting device provided by an embodiment of the disclosure.

As shown in FIG. 3, in an embodiment of the disclosure, the light emitting device 10 includes a structure consisting of four cups. Different from the structure corresponding to FIG. 2, each of the blue light emitting unit 12 and the green light emitting unit 13 in FIG. 3 occupies one cup. Compared with the structure with three cups, the structure with the four cups make a light emitted by each of the four cups be concentrated and has a better light mixing effect, at the same time, the structure with the four cups also has a better heat dissipation effect and can maintain the stability of the thermal performance of each of the light emitting units.

Figure 5:
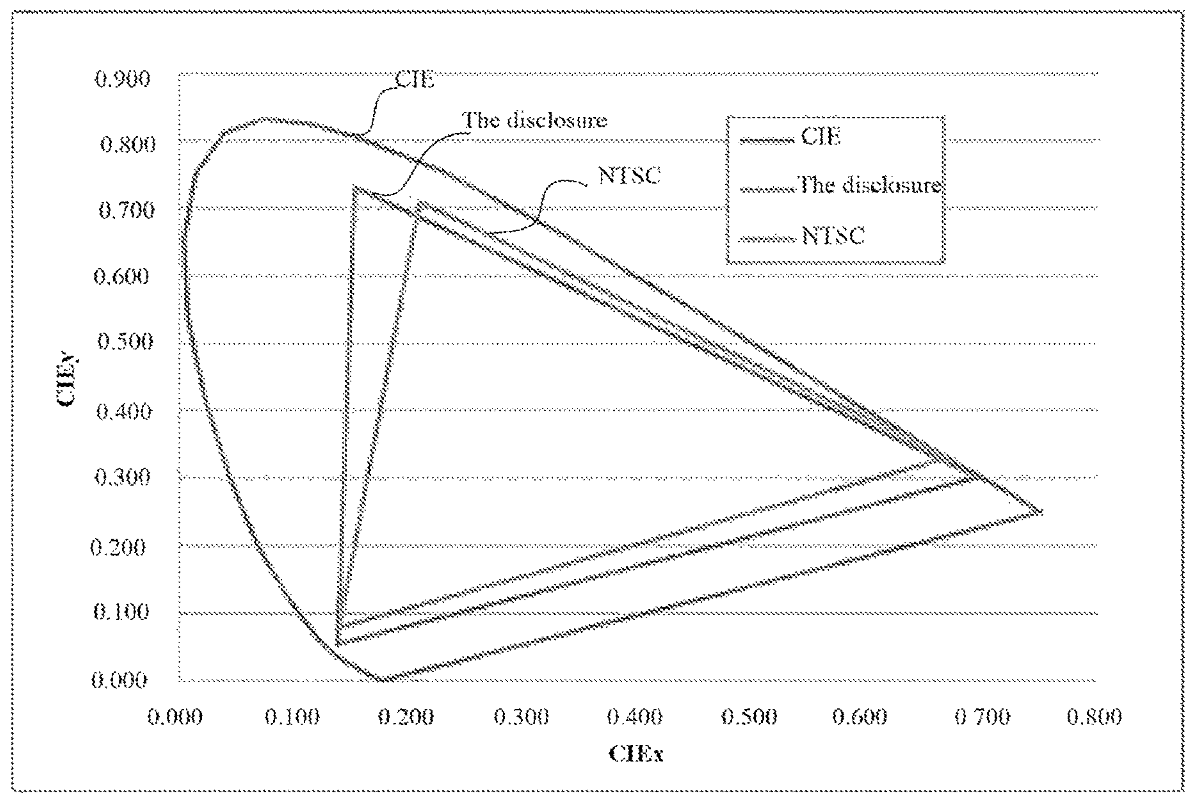
FIG. 5 is a schematic diagram of a color gamut range of a light emitting device provided by an embodiment of the disclosure.

An embodiment of the disclosure provides a light emitting device 10 which has an excellent color tuning effect of an ambient lamp. It should be noted that the higher the color richness of an ambient light, the better the color tuning effect of the ambient lamp, and the color richness of the ambient light can be evaluated by a national television standards committee (NTSC) color gamut. As shown in FIG. 5, NTSC color gamut of the light emitting device 10 provided in this embodiment of the disclosure is large than or equal to 100% NTSC, and the NTSC color gamut of the light emitting device 10 in this embodiment is 118.3% NTSC.

Specifically, TABLE 1 shows parameters of the light emitting device 10 provided by an embodiment of the disclosure, the light emitting device 10 realizes the dimming of color temperature and the tuning of ambient light by adjusting an electric current ratio of the four light emitting units:

TABLE 1

Parameter table of the light emitting device

| CCT | mA | | | | x | y | CRI |
|---|---|---|---|---|---|---|---|
| | B | G | PC red | 30 C. | | | |
| 2700K | 0 | 3 | 10 | 20 | 0.4568 | 0.4127 | 93.9 |
| 3000K | 1 | 4 | 8 | 20 | 0.4280 | 0.4016 | 95 |
| 4000K | 3 | 4 | 4 | 20 | 0.3821 | 0.3775 | 92.6 |
| 5000K | 6 | 7 | 2 | 20 | 0.3403 | 0.3493 | 91.8 |
| 5700K | 7 | 7 | 1 | 20 | 0.3289 | 0.3389 | 90.4 |
| 6500K | 9 | 8 | 0 | 20 | 0.3112 | 0.3249 | 89.3 |

In the TABLE 1, "30 C" means a color temperature of the white light emitting unit 14 being 3000K. A dimming range of the color temperature of the light emitting device 10 is in a range of 2700K to 6500K. In the dimming range of the light emitting device 10, color rendering indexes of the light emitting device 10 are 90 on average. It should be noted that the color temperature of the light emitting device 10 provided by an embodiment of the disclosure can be adjusted to be lower than 2700K or higher than 6500K, and the color temperature of the white light emitting unit 14 can be 2000K or any other color temperature value. The "x" (also referred to CIEx) and "y" (also referred to CIEy) in the TABLE 1 are chromaticity coordinate values corresponding to a color temperature in a chromaticity diagram (also referred to CIE diagram).

Specifically, when the color temperature is adjusted, there are at least three light emitting units emit lights at the same time. In addition, it can be seen in TABLE 1 that the light emitting device 10 can achieve different color temperatures by adjusting electric currents of the four light emitting units. Most of color rendering indexes of the light emitting device 10 provided by the embodiment of the disclosure are greater than 90, i.e., the light emitting device 10 has high color rendering indexes. The higher the color rendering indexes, the easier it is for the human eye to distinguish different colors of objects. Under the light source with poor color rendering property for a long time, the sensitivity of human eye cone cells will be reduced, which is easy to cause eye fatigue. The color rendering indexes of the embodiment of the disclosure are high, which provides a good user experience.

Figure 4:
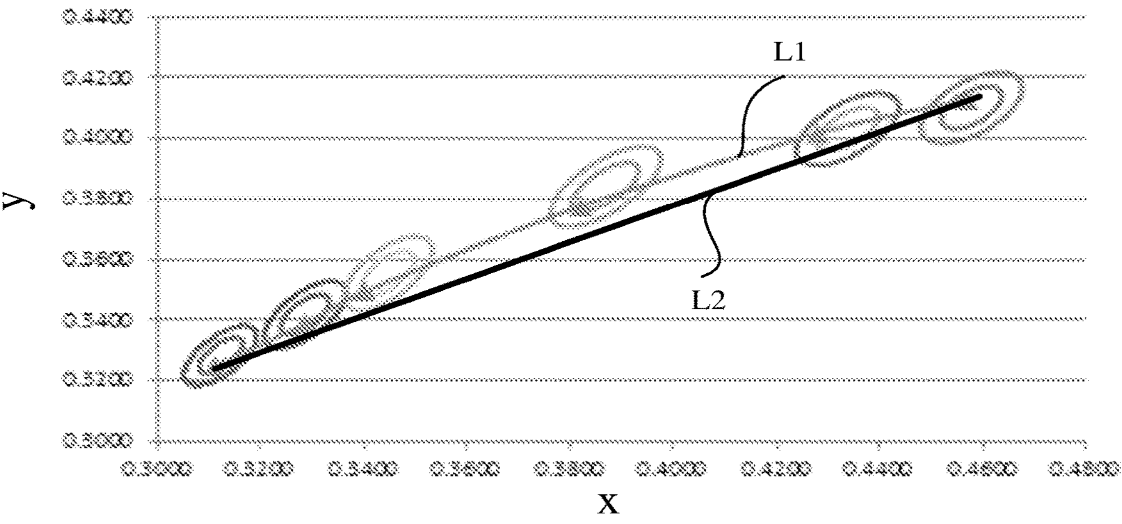
FIG. 4 is a chromaticity diagram of a light emitting device provided by an embodiment of the disclosure.

In an embodiment, as shown in FIG. 4, a light emitting curve of the color temperature device 10 is L1. The color temperature (Triangle in FIG. 4) on the L1 is located in a center of a color temperature range of American national standards institute (ANSI), that is, each the color temperature on the L1 falls between two ellipses adjacent to the color temperature, which indicates a color corresponding to the color temperature is a standard color. Therefore, the light emitting device 10 realizes the tuning of ambient light and the dimming of the color temperature. However, the prior art adopts a scheme of dimming the color temperature with a warm white light and a cold white light: for example, if a color temperature of the warm white light is 2700K and a color temperature of the cold white light is 6500K, then a light emitting curve corresponding to the scheme is a straight line L2, and thus some of color temperatures between the warm white light and the cold white light will not fall between the two ellipses, which is a large deviation from the standard color. In addition, it is necessary to ensure that the color rendering indexes of both warm white light and cold white light reach 90, so that the color rendering index of the dimming effect can reach 90, which are high requirements for the warm white light and the cold white light.

It should be noted that the selection of electric currents will change according to sizes of chips. The parameters in TABLE 1 are only for specific adjustments and controls of the chips used in specific embodiments to verify that the light emitting device 10 of the disclosure can achieve the effect of adjusting the ambient light and the color temperature and high color rendering indexes only by four light emitting units, and the electric current ratio of the light emitting device 10 is not intended to limit the technical scope of the disclosure. In a more general and applicable way, the regulation of each of the light emitting units of the light emitting device 10 of the disclosure is shown by luminance ratios of the light emitting units. The luminance of the white light unit 14 is taken as a reference, TABLE 2 shows parameters of the light emitting device 10 provided by an embodiment of the disclosure, which realizes the dimming of color temperature and the tuning of ambient light by adjusting the luminance ratios of the four light emitting units:

TABLE 2

Parameter table of color temperature and lumen parameters of four light emitting units in the light emitting device

| CCT | lm | | | |
|---|---|---|---|---|
| | B | G | PC red | 30C |
| 2700K | 0.0 | 8.9 | 10.7 | 100 |
| 3000K | 0.6 | 11.9 | 8.6 | 100 |
| 4000K | 1.8 | 11.9 | 4.3 | 100 |
| 5000K | 3.6 | 20.8 | 2.1 | 100 |
| 5700K | 4.2 | 20.8 | 1.1 | 100 |
| 6500K | 5.4 | 23.8 | 0.0 | 100 |

In the TABLE 2, "30C" means a color temperature of the white light emitting unit 14 being 3000K. "lm" is a physical unit called lumen which is used to describe the luminous flux, and the lumen represents a total amount of visible light emitted by a light source in a unit time. When the color temperature of the light emitting device 10 is 2700K, at the same time, a luminous flux of a red light emitted by the red light emitting unit 11 is 10.7 lumens, a luminous flux of a green light emitted by the green light emitting unit 13 is 8.9 lumens, a luminous flux of a blue light emitted by the blue light emitting unit 12 is 0 lumens, and a luminous flux of a white light emitted by the white light emitting unit 14 is 100 lumens. It should be noted that each specific value in the TABLE 2 have a tolerance (i.e., changing range) of ±50%. Although TABLE 2 only shows that the color temperature of the light emitting device 10 changes from 2700K to 6500K, the color temperature of the light emitting device 10 provided by other embodiments of the disclosure can be adjusted to be lower than 2700K or higher than 6500K, and the color temperature of the white light emitting unit can be 2000K or any other color temperature value.

Therefore, the luminance of a red light emitted by the red light emitting unit 11 in the light emitting device 10 participating in mixing light decreases with the increase of color temperature. The luminance of a green light emitted by the green light emitting unit 13 participating in mixing light in the light emitting device 10 increases with the increase of the color temperature. The brightness of a blue light emitted by the blue light emitting unit 12 participating in the mixing light in the light emitting device 10 increases with the increase of the color temperature. It should be noted that "30 C" refers to a color temperature of the white light emitting unit 14 is 3000K. It can be understood that although TABLE 1 and TABLE 2 only show that the color temperature of the light emitting device 10 changes from 2700K to 6500K, the color temperature of the light emitting device 10 provided by other embodiments of the disclosure can be adjusted to be lower than 2700K or higher than 6500K, and the color temperature of the white light emitting unit 14 can be 2000K or any other color temperature value.

Figure 6:
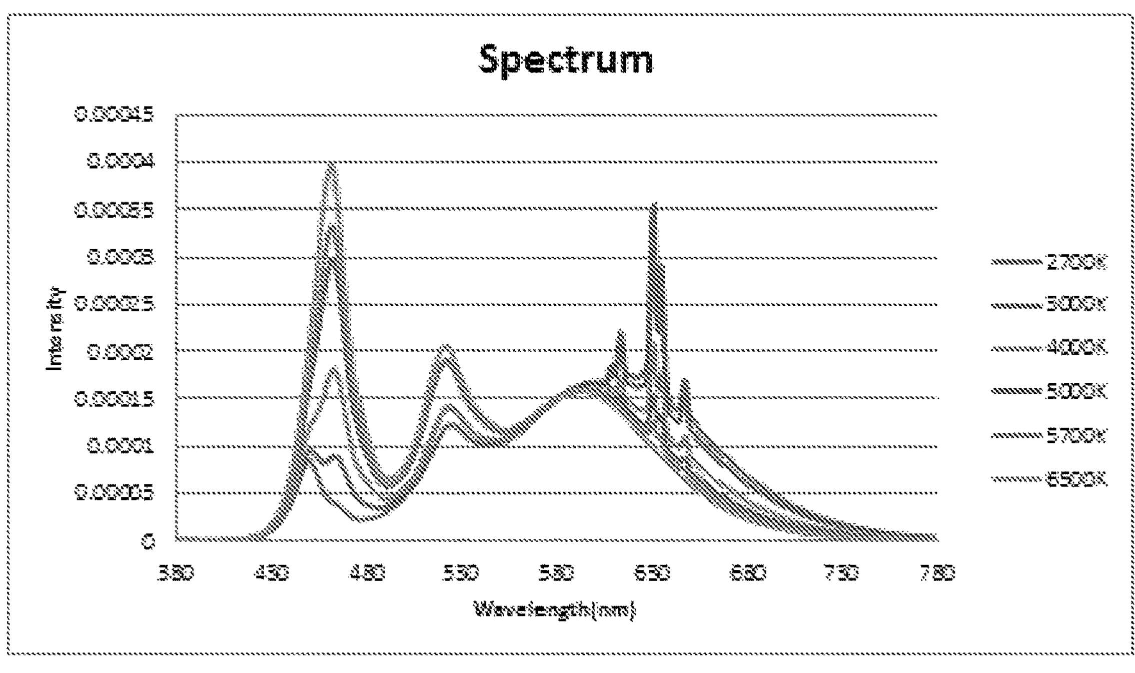
FIG. 6 is a schematic diagram of a spectrum of a light emitting device provided by an embodiment of the disclosure.

As shown in FIG. 6, an emission spectrum of the light emitting device 10 has a first peak, a second peak, and a third peak. Among them, the first peak is located in a wavelength of 615 nm to 635 nm, that is, the first peak is located in a wavelength where the light emitting device 10 emits a red light. The second peak is located in a wavelength of 460 nm to 475 nm, that is, the second peak is located in a wavelength where the light emitting device 10 emits a blue light. The third peak is located in a wavelength of 515 nm to 535 nm, that is, the third peak is located in a wavelength where the light emitting device 10 emits a green light. With the increase of the color temperature of the light emitting device 10, a FWHM corresponding to the second peak increases with the increase of the color temperature. The intensity of the third peak increases with the increase of the color temperature, and the intensity of the first peak decreases with the increase of the color temperature.

In an embodiment of the disclosure, the red light emitting unit 11 uses the technical solution of combining a blue light emitting chip with multiple red phosphors to emit a specific red light, the technical solution can not only replace a traditional red chip to participate in the adjustment of color lights, but also participate in the adjustment of the color temperature of a white light. More importantly, it can make a color rendering index of a final light reach about 90 without requiring that all the color lights participating in the adjustment of the color temperature have high color rendering indexes. Specifically, by adjusting a mass ratio between the first red phosphor and the second red phosphor, the red light emitting unit 11 can emit a red light with a dominant wavelength in a range of 615 nm to 635 nm. Under the excitation of a blue light emitted by the first blue light emitting chip, the KSF phosphor converts a part of the blue light into a narrow-wavelength red light with a peak wavelength in a range of 630 nm to 634 nm, and the long-wavelength nitride red phosphor also converts a part of the blue light into a wide-wavelength red light with a peak wavelength in a range of 635 nm to 660 nm. Among them, the KSF phosphor has a narrow FWHM (FWHM is considered to be narrow if it is less than 30 nm), and thus the spectrum of the red light emitting unit 11 has a narrow peak. Since the color purity of the red light excited by the KSF phosphor is high, it is easy to adjust the light. The nitride red phosphor has good absorption characteristics to the blue light, and thus the long-wavelength nitride red phosphor can continue to convert and absorb the blue light emitted by the first blue light emitting chip while not absorbed by the KSF phosphor, thus reducing the impact of the blue light emitted by the first blue light emitting chip on the color purity of the red light emitted by the red light emitting unit 11.

Figure 7:
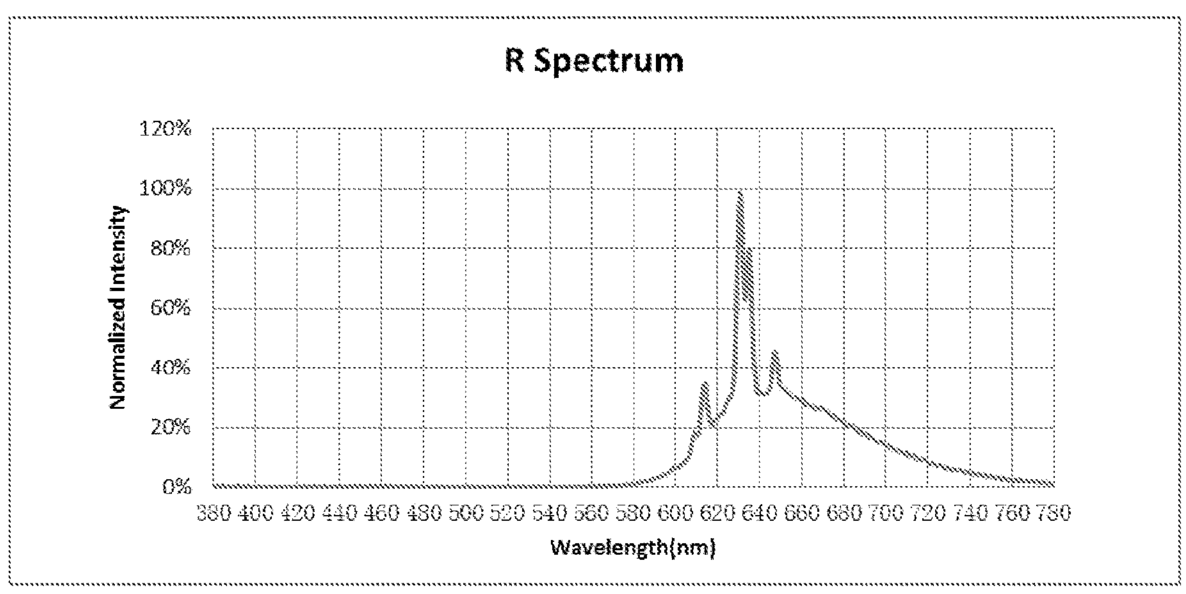
FIG. 7 is a schematic diagram of a spectrum of a red light emitting unit in a light emitting device provided by an embodiment of the disclosure.

As shown in FIG. 7, in a diagram of an emission spectrum of the red light emitting unit 11, the emission spectrum of the red light emitting unit 11 has a first peak located in a wavelength of 615 nm to 635 nm. The intensity corresponding to the first peak is 100% in FIG. 7. The intensity of the red light emitting unit 11 in a nanometer wavelength (i.e., a range of a dominant wavelength of a light emitted by the first blue light emitting chip) is less than or equal to 10% of the intensity corresponding to the first peak. It can be seen that although the red phosphor of the red light emitting unit is excited by the first blue light emitting chip to emit a red light, the red light emitted by the red light emitting unit 11 has high color purity and luminance. Furthermore, as shown in FIG. 7, in an embodiment of the disclosure, the intensity of the red light emitting unit 11 in a wavelength of 660 nm is in a range of 15% to 40% of the intensity corresponding to the first peak. It should be noted that when the intensity of the red light emitting unit 11 in the wavelength of 660 nm is less than 15% of the intensity corresponding to the first peak or more than 40% of the intensity corresponding to the first peak, it means that the light emitted by the first blue light emitting chip is not fully absorbed and converted, or is excessively absorbed and converted by the long-wave nitride red phosphor, therefore resulting in a poor luminance effect. Of course, it can be understood that in an embodiment of the disclosure, the peak wavelength of the long-wavelength nitride red phosphor used is in a range of 635 nm to 660 nm, for example, 650 nm, and the emission spectrum of the red light emitting unit 11 with the peak wavelength of 650 nm still has the above characteristics as it has a peak wavelength of 660 nm. Since mutual interferences of emission spectrums of different phosphors, it is not easy to measure the intensity of the red light emitting unit 11 with the peak wavelength of 650 nm. Therefore, the parameters of the red light emitting unit 11 measured at a wavelength of 660 nm are taken as a standard in the embodiments of the disclosure.

Since the red phosphors are used in the red light emitting unit 11 and the white light emitting unit 14 to emit red lights. Therefore, in order to avoid the mutual interference of the red lights of the red light emitting unit 11 and the white light emitting unit 14 affecting the tuning of ambient light and the dimming of color temperature of the light emitting device 10, the color rendering index of the white light emitting unit 14 does not need to be too high. If the color rendering index of the white light emitting unit 14 is high, the spectrum of the red light emitted by the third red phosphor in the white light emitting unit 14 may excessively overlap with the spectrum of the red light emitted by the red light emitting unit 11, which makes the overlapped spectrum fail to meet the requirements of tuning ambient light and dimming color temperature. Therefore, it is recommended that the color rendering index of the white light emitting unit 14 is less than or equal to 80. The FWHM of the white light emitted by the white light emitting unit 14 is less than or equal to 110 nm. Specifically, in an embodiment, the color rendering index of the white light emitting unit 14 is suggested to be about 70. Therefore, it can be understood that although the color rendering index of the white light emitting unit 14 is low, the color rendering index of the light emitting device 10 can also be high.

In an embodiment of the disclosure, the light emitting device 10 is designed with a structure including the red light emitting unit 11, the blue light emitting unit 12, the green light emitting unit 13 and the white light emitting unit 14, and the red light emitting unit 11 includes the KSF phosphor with a very narrow FWHM and a peak, the long-wavelength nitride red phosphor which can absorb the blue light, and the first blue light emitting chip. Therefore, the tuning of ambient light and dimming of color temperature can be realized by the four light emitting units, which reduces the cost. In addition, the light emitting device 10 provided by the embodiment further has a beneficial effect that although the color rendering index of the white light emitting unit 14 is low, the color rendering index of the light emitting device 10 is high.

Finally, it should be noted that the above embodiments are only used to illustrate the technical solutions of the disclosure, not to limit it; Although the disclosure has been described in detail with reference to the preceding embodiments, those skilled in the art should understand that they can still modify the technical solutions recorded in the preceding embodiments, or equivalent replace some of the technical features. These modifications or substitutions do not make the essence of the corresponding technical solutions separate from the spirit and scope of the technical solutions in the embodiments of the disclosure.

What is claimed is:

1. A light emitting device, comprising: a red light emitting unit, a blue light emitting unit, a green light emitting unit, and a white light emitting unit;

wherein the red light emitting unit comprises a first blue light emitting chip and a red fluorescent material, and a dominant wavelength of a light emitted by the red light emitting unit is in a range of 615 nanometers (nm) to 635 nm;

wherein the green light emitting unit comprises at least one green chip, and a dominant wavelength of the green chip of the green light emitting unit is in a range of 515 nm to 535 nm; and wherein an emission spectrum of the light emitting device has a first peak in a wavelength of 460 nm to 475 nm and a second peak in a wavelength of 515 nm to 535 nm, a full width half maximum (FWHM) corresponding to the first peak increases with the increase of a color temperature of the light emitting device, and the second peak increases with the increase of the color temperature of the light emitting device.

2. The light emitting device according to claim 1, wherein the red fluorescent material comprises a first red phosphor and a second red phosphor, and the first red phosphor is different from the second red phosphor.

3. The light emitting device according to claim 2, wherein the first red phosphor is KSF, and the second red phosphor is CASN; and/or, wherein a peak wavelength of the second red phosphor is in a range of 635 nm to 660 nm.

4. The light emitting device according to claim 2, wherein an FWHM of a white light emitted by the white light emitting unit is less than or equal to 110 nm.

5. The light emitting device according to claim 1, wherein a dominant wavelength of the first blue light emitting chip is in a range of 445 nm to 460 nm.

6. The light emitting device according to claim 1, wherein an emission spectrum of the red light emitting unit has a third peak in a wavelength of 615 nm to 635 nm, an intensity of the emission spectrum of the red light emitting unit in a wavelength of 445 nm to 460 nm is less than or equal to 10% of an intensity corresponding to the third peak, and the third peak decreases with the increase of the color temperature of the light emitting device.

7. The light emitting device according to claim 6, wherein the intensity of the emission spectrum of the red light emitting unit at a wavelength of 660 nm is in a range of 15% to 40% of the intensity corresponding to the third peak.

8. The light emitting device according to claim 1, wherein the blue light emitting unit comprises at least one blue chip, and a dominant wavelength of the blue chip is in a range of 460 nm to 475 nm.

9. The light emitting device according to claim 1, wherein a color temperature of the white light emitting unit is in a range of 1800 Kelvin (K) to 3000K; and/or, wherein a color rendering index of the white light emitting unit is less than 80.

10. The light emitting device according to claim 1, wherein the white light emitting unit comprises a second blue light emitting chip and a multicolor fluorescent material; a dominant wavelength of the second blue light emitting chip is in a range of 445 nm to 460 nm, the multicolor fluorescent material comprises a third red phosphor, and a peak wavelength of an emission of the third red phosphor is in a range of 605 nm to 620 nm.

11. The light emitting device according to claim 10, wherein the multicolor fluorescent material further comprises at least one of a green phosphor and a yellow-green phosphor.

12. The light emitting device according to claim 10, wherein the white light emitting unit further comprises another second blue light emitting chip with a dominant wavelength in a range of 445 nm to 460 nm.

13. The light emitting device according to claim 1, wherein a dimming range of a color temperature of the light emitting device is in a range of 2700K to 6500K.

14. The light emitting device according to claim 1, wherein a national television standards committee (NTSC) color gamut of the light emitting device is larger than or equal to 100% NTSC; and wherein the red light emitting unit, the blue light emitting unit, the green light emitting unit, and the white light emitting unit cooperate to emit light with a color rendering index of at least 90.

15. The light emitting device according to claim 1, wherein the red light emitting unit, the green light emitting unit, the blue light emitting unit and the white light emitting unit are configured to form at least two independent light emitting components.

16. The light emitting device according to claim 1, wherein the red light emitting unit, the green light emitting unit, the blue light emitting unit and the white light emitting unit are different parts of a same light emitting component.

17. The light emitting device according to claim 1, wherein the blue light emitting unit and the green light emitting unit are packaged together, and the blue light emitting unit and the green light emitting unit are disposed between the red light emitting unit and the white light emitting unit.

18. The light emitting device according to claim 1, wherein the red light emitting unit, the blue light emitting unit, the green light emitting unit, and the white light emitting unit are independently packaged with one another.

19. A light emitting device, comprising: a red light emitting unit, a blue light emitting unit, a green light emitting unit, and a white light emitting unit;

wherein the red light emitting unit comprises a first blue light emitting chip and a red fluorescent material, and a dominant wavelength of a light emitted by the red light emitting unit is in a range of 615 nm to 635 nm;

wherein an FWHM of a white light emitted by the white light emitting unit is less than or equal to 110 nm; and wherein an emission spectrum of the light emitting device has a first peak in a wavelength of 460 nm to 475 nm and a second peak in a wavelength of 515 nm to 535 nm; an emission spectrum of the red light emitting unit has a third peak in a wavelength of 615 nm to 635 nm; and an FWHM corresponding to the first peak increases with the increase of a color temperature of the light emitting device, the second peak increases with the increase of the color temperature of the light emitting device, and the third peak decreases with the increase of the color temperature of the light emitting device.

* * * * *